United States Patent [19]

Black et al.

[11] Patent Number: 5,394,106

[45] Date of Patent: Feb. 28, 1995

[54] APPARATUS AND METHOD FOR SYNTHESIS OF SIGNALS WITH PROGRAMMABLE PERIODS

[75] Inventors: Alistair D. Black, Los Gatos; Thomas M. Tobin, Santa Cruz, both of Calif.

[73] Assignee: Gadzoox Microsystems, Los Gatos

[21] Appl. No.: 114,958

[22] Filed: Aug. 31, 1993

[51] Int. Cl.$^6$ ............................................. H03L 7/18
[52] U.S. Cl. ................................. 327/107; 375/371; 377/39; 327/113
[58] Field of Search ................... 328/186, 14, 188, 55; 307/271, 265, 603, 516; 375/118; 364/721, 718; 377/39; 340/146.2

[56] References Cited

U.S. PATENT DOCUMENTS

| | | | |
|---|---|---|---|
| 3,633,017 | 1/1972 | Crooke et al. | 364/221 |
| 3,746,891 | 7/1973 | Rowe | 307/271 |
| 4,240,034 | 12/1980 | Lowenschuss | 328/14 |
| 4,328,554 | 5/1982 | Mantione | 364/221 |
| 4,476,536 | 10/1984 | Jones, Jr. | 364/721 |
| 4,652,832 | 3/1987 | Jasper | 364/221 |
| 4,886,881 | 2/1989 | Ives et al. | 322/22 |
| 4,933,898 | 6/1990 | Nuytkens et al. | 364/721 |

OTHER PUBLICATIONS

Delay lines-take on timing tasks, Components EDN Dec. 1991, pp. 108–111.

When Digital Systems Need Variable Delays, Commercial Devices, Home-Brew-Circuits, Or Semicustom LSI Designs Can Do The Job, A Step-By-Step Guide To Programmable Delays; Design Applications, Electronic Design, Jun. 13, 1991, pp. 97–175.

Pipelining, What is Pipelining; pp. 251–267.

Limits and Measurements of Jitter Tolerance in Digital Transmission Systems; Dr. Tom Crawford, Geoff Thow and Peter Scott, Hewlett-Packard Ltd. Error Performance Analysis of Digital Transmission Systems, pp. 153–179.

Specifications for Measuring Equipment, Series 0 Recommendations, vol. IV-Fascicle IV.4, International Telecommunication Union, CCITT The International Telegraph and Telephone Consultative Committee, Nov. 1988, pp. 195–204.

Primary Examiner—Timothy P. Callahan
Assistant Examiner—Dinh Le
Attorney, Agent, or Firm—Falk, Vestal & Fish; Ron Fish

[57] ABSTRACT

A synthesized jitter generator employing a novel digital architecture is provided. The apparatus provides period synthesis and controlled sinusoidal and non-sinusoidal jitter modulation functions of a square wave provided at its output. The architecture consists of a coupling of an N+M bit digital accumulator and an N bit synchronous counter to an N bit magnitude compare circuit. The output of the magnitude compare strobes the accumulator when the two inputs are equal in magnitude causing the accumulator to increment synchronously. The output of the magnitude compare is also a digital waveform whose average period is precisely defined by the input word to the accumulator. The lower M bits of the accumulator, which are not connected to the magnitude compare and which represent fractional clock periods, are connected to a programmable delay line which provides a correction in time to the magnitude compare output so that both the instantaneous and the average periods of the digital waveform at the delay line output reflect the accumulator input word. The input to the accumulator may be varied, creating a period modulated output from the apparatus. The modulation of the digital output of the accumulator by way of an adder placed between the accumulator and the magnitude compare allows direct time (jitter) modulation of the output waveform.

13 Claims, 11 Drawing Sheets

APPARATUS AND METHOD FOR SYNTHESIS OF SIGNALS WITH PROGRAMMABLE PERIODS

BACKGROUND OF THE INVENTION

The present invention relates to an apparatus for jitter generation used in measurement systems which evaluate the specifications of digital communication receivers as well as providing a general method of synthesis of programmable periods.

Stress testing of digital communication receivers is currently performed using a digital data source with the property that its output test waveform may be modulated in time in some predetermined way. This data source is known as a jitter generator. This source is composed of a radio-frequency (RF) synthesizer which is phase or frequency modulated by a second, lower frequency synthesizer to produce a sinusoidal clock signal with timing modulation (jitter). This sinusoidal signal is then amplitude limited to produce a digital square waveform. This output is then sent to a digital circuit which will produce the desired test sequence for the device under test. Such a jitter generator is used for the test of many standard communication links such as specified in The International Telegraph and Telephone Consultative Committee (hereafter referred to as CCITT) Recommendation "Timing Jitter Measuring Equipment for Digital Systems", Vol. IV, Rec. 0.171, which is incorporated by reference. An example of an apparatus used for jitter generation is described by P. R. Trischitta, and P. Sannuti, "The Jitter Tolerance of Fiber Optic Regenerators", IEEE Transactions on Communications, Vol. COM-35, NO. 12, December 1987, which is hereby incorporated by reference. In both of these references the "Jitter Generator" is formed using a lower frequency sine wave generator which modulates a high frequency RF synthesizer followed by a data generator.

The principal limitations of this approach are:

First, RF synthesizers are not easily modulated by amounts in excess of several tens of cycles of the output period due to the analog nature of the internal modulation circuits, thus the range of the jitter amplitude that can be used in a jitter tolerance measurement is limited. Second, the exact amount of movement in time of the test signal produced by the RF synthesizer is not known accurately and must be characterized, or calibrated, externally.

Third, the jitter bandwidth (modulation bandwidth) of these techniques is limited by the modulation capability of the synthesizer. The result is a modulation of only several hundreds kilohertz of sine wave modulation. Finally, this approach to jitter generation requires multiple pieces of measurement equipment.

It is desirable to provide a jitter generation capability with broader jitter bandwidth, sinusoidal and non-sinusoidal jitter generation, much larger jitter amplitude, a calibrated jitter amplitude, and a more compact system design in order to more accurately characterize high speed receiver components. However, the synthesized control of waveform period should be retained.

OBJECTS OF THE INVENTION

In view of the forgoing limitations with the known prior art, it is an object of this invention to provide jitter generation capability which has a large timing jitter amplitude and a large dynamic range. It is also the object of this invention to provide precise values of timing jitter amplitude. It is also an object of this invention to provide a synthesized jitter source with a large jitter bandwidth and the capability of sinusoidal and non-sinusoidal jitter functions. It is also an object of this invention to provide a digital architecture for jitter generation which has the advantages of reliability, modulation bandwidth, and sealability inherent to digital systems. It is also an object of this invention to provide this capability in a highly integrated form, consisting of one or two integrated circuits, resulting in excellent repeatability and low cost.

SUMMARY OF THE INVENTION

The present invention overcomes the above described limitations of the prior art by using a novel digital architecture capable of synthesizing a digital waveform consisting of a sequence of periods of arbitrary lengths. In addition, the invention has utility above and beyond those applications described herein.

This apparatus in its most basic form consists of an (N+M) bit digital accumulator with the upper N bits connected to input A of an N bit magnitude compare circuit while input B of the magnitude compare is connected to an N bit synchronous counter. The magnitude compare circuit outputs a logical one when input A=input B. The counter is clocked by the system clock, and the accumulator is incremented by the output of the magnitude compare circuit. The output of the circuit is taken at the output of the magnitude compare circuit. There is a hold register at the input of the accumulator which stores a digital input word, $T_{in}$. If the accumulator output is some binary number T0, and the counter is allowed to begin counting from 0, there will be an output when input B=input A. This output will in turn increment the accumulator causing a new value equal to $T0+T_{in}$ to appear at input A of the magnitude compare. If the counter is allowed to continue to count, the next output will occur when the counter output is $T0+T_{in}$. Again, the accumulator will be clocked producing a new value at input A of $T0+T_{in}+T_{in}$, which will again cause an output of the magnitude compare when the counter reaches the new value. Thus, the counter in this circuit forms the time clock which marks off time continuously, while the accumulator arithmetically calculates the next desired output mark whenever incremented. The output of the circuit occurs then at a time which is the value of the accumulator times the system clock period where the time between any two outputs is defined by the input word $T_{in}$. This circuit will continue to output pulses every $T_{in}$ counts of the system clock so long as the value of the input word $T_{in}$ is less than the maximum value of the counter $2^N$, where N is the number of bits and $T_{in}$ is greater than or equal to 1. In this case the accumulator will always roll over before the counter, and the series of output pulses will continue unaffected. Further, if a new digital word appears at $T_{in}$, there will be a corresponding change in the number of clock pulses between the next two output pulses. The resolution of the output pulse period is limited to a single system clock pulse. However, the accumulator has M bits of resolution below the upper N bits. The actual resolution of the input, $T_{in}$, is $2^{-M}$. $T_{in}$ may be programmed to values such as 1, 1.125, 1.5 etc. depending on the number of bits M in the accumulator. The output, which occurs only at times which correspond to integer clock periods, is then a truncation of the actual accumulator output value. This results in an error in the value of the instantaneous period of the output. However, since the truncation of the digital word occurs at the output of the accumulator, the average of many output periods of the device will accurately reflect the programmed fractional period. If the system clock is a stable oscillator of constant known period then a specific average output period is known from the relation Tout(average)=$T_{in} \times T_{clock}$, where $T_{in}$ may be a fractional number. In this way output periods which are not sub-harmonics of the clock frequency may be synthesized. Furthermore, the lower M bits of the accumulator represent the fractional correction that is required to make the instantaneous period equal to the programmed value. In the present invention this correction value is passed to a programmable delay line which has the property that its internal time delay from input to output varies linearly with the value of a digital word applied to its data input. The delay line then performs the correction to the output of the magnitude compare circuit resulting in an accurate instantaneous as well as average period value. Such delay lines are common in the art and examples of such a line are described in Ormond, "Delay Lines Take On Timing Tasks", EDN, Dec. 19, 1991, which is hereby incorporated by reference. This article teaches how to build digitally programmable delay lines and gives an example which is suitable for use up to about 300 MHz. If applications require higher speed, "ping-pong" or multiple tandem delay lines may be used so that the digital word defining the desired delay can be altered fast enough to keep up with the pace of the synthesis of signals by the invention. That is, the desired delay word can be generated and applied to one delay line, while the digital word desired for the next delay can be generated and applied to the input of the second delay line. Thereafter, the delay word for the next desired delay can be generated and applied to the delay input of the first delay line in preparation for the next desired delay. When it is time to impose that delay, the output of the synthesizer is switched to the input of the first delay line. The outputs of the delay lines are then also multiplexed together in the same way as the inputs. This methodology effectively halves the rate at which the delay lines need to accept, process and implement delay words.

Further, a large number of other types of delay lines are described in "A Step-By-Step Guide to Programmable Delays", by Richard Feldman and David Rosky, in *Electronic Design*, pp. 97–105, Jun. 13, 1991, all of which are incorporated by reference.

In the preferred embodiment of this apparatus there is also included after the accumulator and before the magnitude compare input A an M+N bit adder, which will arithmetically add the output of the accumulator to another input word $D_{in}$. The apparatus works just as before except that an offset of value $D_{in}$ is included in the defining relation for the output. The instantaneous output period of the device may be described by the following equation: $T_{output}(k) = T_{in}(k) \times T_{clock} + (D_{in}(k) - D_{in}(k-1))$, where k is an integer number. Thus, an output sequence of periods is described which may be directly modulated with high bandwidth and arbitrary function by controlling $D_{in}(k)$ and $T_{in}(k)$. Also, since this apparatus digitally synthesizes periods which are arithmetically related to the system clock oscillator, these periods can be precisely known which allows for accurate jitter generation. Further, since this technique is numerical the limits on range and resolution of the output periods is limited by the number of bits in the accumulator and may be scaled to the needs of a particular design. Of course, if $T_{in}(k)$ is a sequence of values provided from an external memory, virtually any deterministic sequence of time periods limited by the restrictions already mentioned may be created, including those specified for jitter generation. Finally, since the system described is a digital architecture it is readily integrated, creating a high quality, low cost, modulatable signal source for many uses beyond that of jitter generation.

It may also be noted that since this apparatus is a digital period synthesizer it is related, but not identical to digital frequency synthesizers such as those described in U.S. Pat. No. 3,735,269 entitled "Digital Frequency Synthesizer," granted to Leland B. Jackson on May 22, 1973, and U.S. Pat. No. 4,476,536 entitled "Digital Sine Wave Synthesizing Method and Apparatus," granted to Gardner D. Jones, Jr. on Oct. 9, 1984. These devices develop an arithmetic relation between a digital input word and an output frequency. The result is that they provide linear programming in frequency and phase, unlike the present invention, which provides linear programming in period and time delay. However, the art of digital frequency synthesis is useful to build an understanding of the present invention.

Generally speaking, there are several key problems that prior art system have not been able to solve to date. One is how to digitally program or control the period of a synthesized signal on an instantaneous basis. Another very important problem not solved by the prior art to date is how to maintain precise control over the period of the synthesis; specifically how to precisely control the instantaneous and average periods of the synthesized signal. Finally, the prior art systems to date have not been able to generated synthesized signals which are programmable directly in terms of period and delay rather than frequency and phase.

The key functional components and their interrelationships of the invention described herein which allow these problems to be solved are as follows. Critical functional elements are a digital word encoding the desired period and using that word to alter a target or comparison value against which a second digital value is compared. This second digital value must be generated by adding up increments of time as marked by a time reference such as a system clock. When the comparison value and the second digital value match some indication thereof must be generated and that indication must trigger an incrementation of the target or comparison value by whatever amount is currently encoded in the user supplied input digital word encoding the period. Any system which can perform these functions and implement these functional relationships will embody the fundamental teachings of the invention. FIG. 1A, without the delay line and without the N+M bit target word, i.e., with a target word which uses all available bits for the comparison, is an example of one implementation of the most fundamental teachings of the invention.

Another key functional aspect of the invention is to provide a digitally programmable delay at the output of the synthesizer where the amount of the delay is determined by a remainder where the remainder constitutes the lower M bits of the target word. This provides the capability to move the edges which define the period individually in either opposite directions or in the same direction so as to provide very fine resolution on the resulting period output. Any system which can perform this function and implement the functional relationships described in this paragraph will embody the fundamental teachings of this embodiment of the invention. FIG. 1A is an example of one implementation of the teachings of this particular embodiment of the invention.

Another important embodiment, uses some means to instantaneously add a user definable number to the target word at a point before the comparison and to be able to alter the target word in this manner at will.

DETAILED DESCRIPTION OF THE INVENTION

Figure 1A:
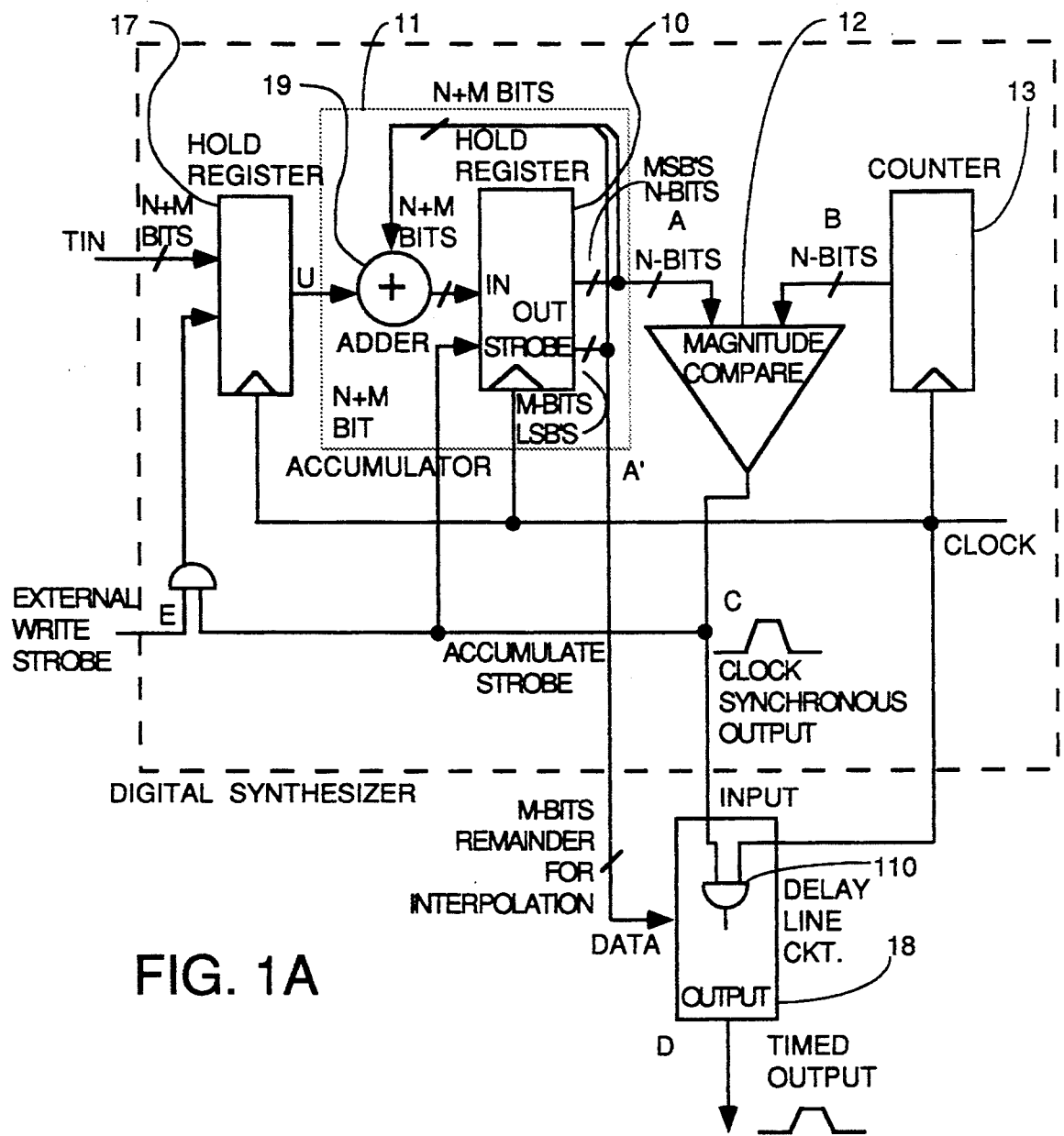
FIG. 1A shows the schematic block diagram of the first embodiment of the present invention.
Figure 1B:
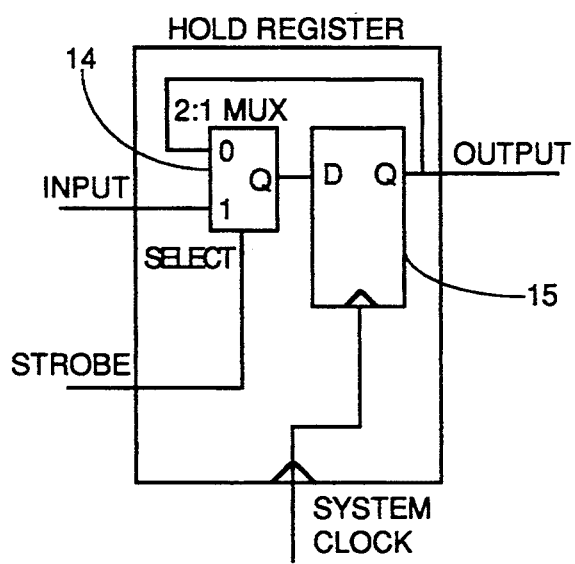
FIG. 1B shows the schematic block diagram of a hold register used in the first embodiment of the present invention shown in FIG. 1A and in other embodiments.

Referring now to FIG. 1A we see the basic building blocks of the digital synthesizer portion of the invention. This portion consists of an N+M bit accumulator, 11, an N bit magnitude compare circuit, 12, and an N bit synchronous counter, 13. The accumulator consists of an adder, 19, followed by a multiplexer register combination known in the art as a hold-register, 10. The purpose of a hold register, shown in FIG. 1B, is to hold the current data even as the D-type register, 15, is clocked by the system clock. The presence of a write strobe causes the multiplexer, 14, to switch from its normal position, connecting the register input to its own output in feedback, to another position which connects the input data of the composite device to the D input of the register. The next occurrence of the active edge of the system clock causes the data at the input of the hold register to be loaded and presented at its output. The effect of using this circuit is to allow normal, ungated clocking of the register by the system clock while allowing a separate, synchronous strobe input to cause the register to load new data. This specific circuit will hereafter be referred to as a hold-register. Thus, the accumulator, which consists of an adder followed by a hold register with the hold register output fed back into one of the adder inputs, is a fully synchronous circuit which will only increment its digital value if it is clocked in the presence of a write strobe such as the accumulate strobe provided by the magnitude compare output. If an input word U is present at the other input of the adder and the accumulate strobe is enabled, the next clock of the accumulator will cause the output A+A' to increment upward by the value U. This will continue for each clock pulse which occurs in the presence of an asserted write strobe. When the accumulator overflows by incrementing beyond its maximum value, the word A+A' will simply have lost a constant amount equal to $2^n$. The output word, A, which consists of the upper N bits of the accumulator section, is fed to one of the inputs of the magnitude compare, while the other input, a word of value B, comes from the N bit synchronous counter. The magnitude compare circuit outputs a one when the inputs, A and B, are equal. The output of the magnitude compare is then fed to the strobe input of the hold register in the accumulator section. The N+M bits of register in the accumulator section along with the N bits of the counter are clocked with the system clock. Thus the entire circuit is of synchronous design. The input hold register, 17, in FIG. 1A that has as its output U and its input $T_{in}(k)$ is included for completeness. Thus, the output of the digital synthesizer portion of FIG. 1A is the output of the magnitude compare, which is zero until the counter counts to the value of the upper N bits of the accumulator output, A. When input B=input A an output is generated and the Accumulate Strobe line, C, is asserted. On the next clock the accumulator is incremented by the amount U held by the input hold register, and the input hold register will load new data, $T_{in}$, if the external write strobe E is also asserted. The counter continues to count on every system clock cycle. Thus, the counter in this circuit forms the time clock which marks off time continuously, while the accumulator section arithmetically calculates the next desired period mark whenever incremented. The magnitude compare circuit outputs a logical one when the actual time as determined by the counter is equal to the calculated time as determined by the accumulator section. The period of the synthesizer is determined by the input word, $T_{in}(k)$, which propagates at each accumulator strobe first to U and then to A as the sum of U and the previous accumulator value. Assume for now that the lower M bits of the input are zero. Then if $T_{in}(k)$ is a sequence of input values, then the digital synthesizer will output a sequence of pulses, one each at time values $C(k)$, where $C(k)-C(K-1)=T_{in}(k-1) \times T_{clock}$.

If the lower M input bits are used, the resolution of the period setting, $T_{in}$, is improved. Since the upper N bits connect to the magnitude compare along with the N bit counter, the basic operation of the circuit is the same as the case when the lower bits are zero. However, since the input and the accumulator now have M bits resolution below that of one clock cycle, periods may be programmed which are fractional. Fractional periods may be defined with a resolution of $2^{-M}$, with an output produced from the digital synthesizer at the integer truncation of the full accumulator value corresponding only to the value of A. The value of A', the lower M bits of the accumulator, is the remainder of the accumulator value, which represents a fraction of a clock cycle. Thus the instantaneous output periods in the case of fractional period programming are not equal to the input word $T_{in}(k) \times T_{clock}$. However, since the truncation occurs after the accumulator, the average of many output periods will asymptotically approach the input word as the number of periods averaged increases. Thus, the long term period is correct while the short term period is not. This problem may be corrected if a digitally controlled delay line, 18, is used. The remainder is passed to the data input of the delay line while the magnitude compare output, C, is connected to the signal input of the delay line. The delay line has the property that its propagation delay from signal input to output, t, is a linear function of the digital input data word. This relation may be described by the equation: $c + W \times R = t$, where c is a constant fixed delay, W is the magnitude of the digital input word, and R is the resolution in time of the line. Thus, the propagation delay of the line is made to change in accordance with the remainder of the accumulator output. It is a further requirement that the delay of the line be adjusted such that $(W_{max}+1) \times R = T_{clock}$. This equation relates the delay line resolution R to the clock period, $T_{clock}$. The delay line 18 in FIG. 1 does not have to be an M-bit digital programmable delay line. It may also be a Q bit digital programmable delay line where Q is any integer equal to or less than M. Since a binary number of Q bits can have a maximum value, $W_{max}$, in the decimal or base 10 numbering system equal to $2^Q - 1$, the equation $(W_{max}-1) \times R = T_{clock}$ may be rewritten as $R = 2^{-Q} \times T_{clock}$. The output of the delay line is then the timing corrected period boundary, D (k). The instantaneous period formed by any two such boundaries is then $D(k) - D(k-1) = (k-1) \times T_{clock}$, an accurate reflection of the period input data. Thus, even though these period inputs are not integer multiples of the system clock they are faithfully produced within the limits of the accuracy of the delay line. Note also that at the beginning of the delay line the magnitude compare output is gated with the system clock in an AND gate, 110. This allows consecutive 1's, which have no transition between them, to be output from the magnitude compare making the digital synthesizer portion of the system fully synchronous, but producing for the delay element two separate positive going transitions, one for each intended pulse. This approach allows period lengths as short as one system clock period to be produced. It should be noted that the timing between the output, C, of the magnitude compare and the system clock into the AND gate is critical, and requires the addition of a small delay in the input which comes from the system clock to prevent unintended pulses, or glitches which might occur if the falling edge of the magnitude compare output reaches the AND gate after the delayed system clock. In other words, if the delayed system clock reaches the AND gate in the delay line signal input after the falling edge of the comparator output signal no unintended pulses or glitches will appear.

Figure 2:
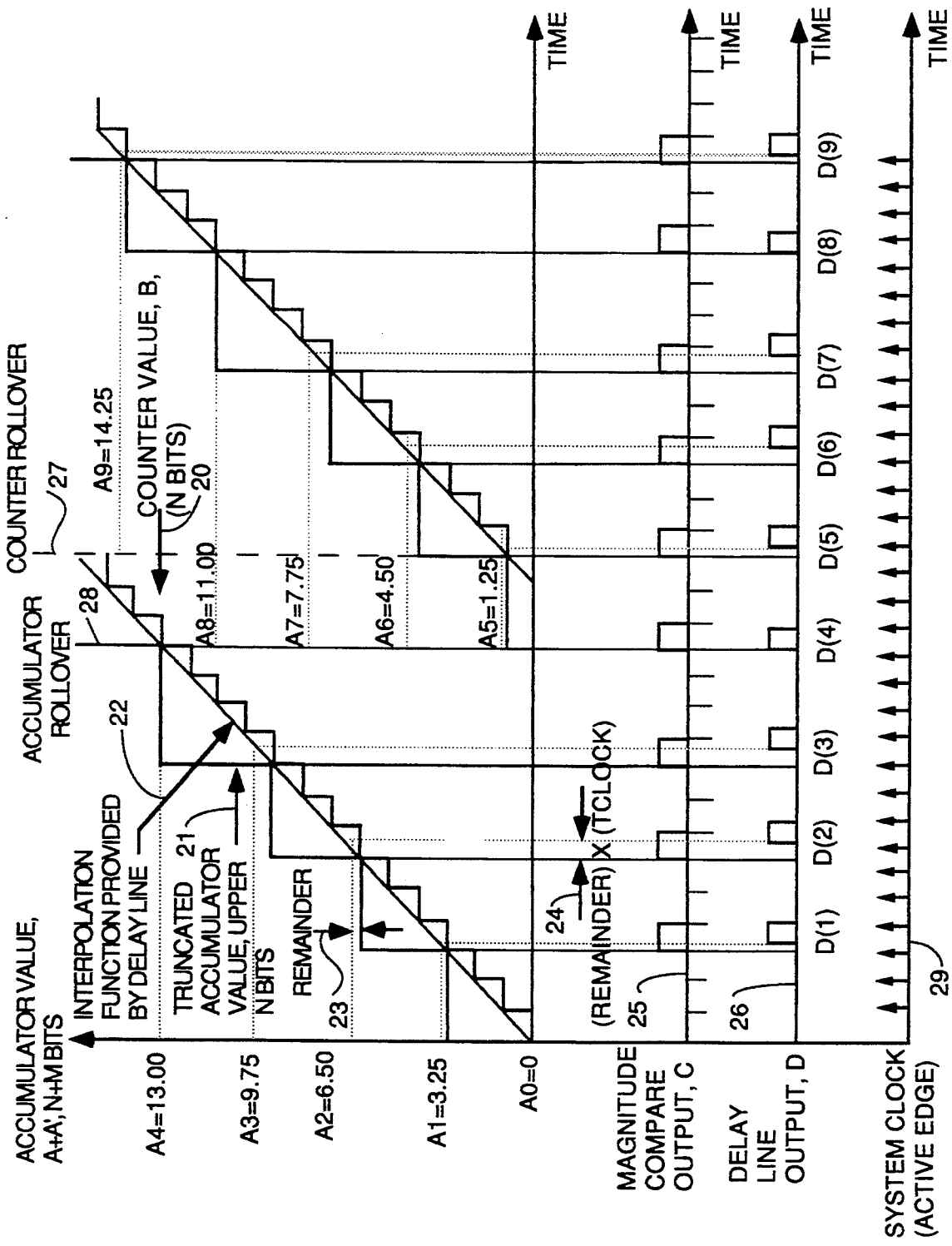
FIG. 2 illustrates, by way of example, the operation of the apparatus in FIG. 1A. Various timing diagrams of signals occurring in the apparatus are shown.

In order to clarify the operation of the circuit as presented so far consider an example where N=4 bits and M=2 bits. This results in a system of resolution $2^{-2}$, or 0.25, times the clock period. If we refer to FIG. 2 we see a plot of both the truncated accumulator value A, 21, which consists of a sequence of large steps, and the counter value B, 20, which consists of smaller, regular, steps as well as the outputs of the magnitude compare, 25, the delay line, 26, and the system clock, 29. The 45 degree straight line that is tangent to the counter pattern, 22, represents the interpolation provided by the delay line. Ideally this function would have steps like the counter function only much smaller (depending on the number of bits M); however, it has been drawn as a straight liner or simplicity. Note that the counter simply increments from 0 to 15 and then repeats in a quantized triangle wave pattern. This triangle wave pattern is produced because of the limited number of bits (N) available for counting and accumulation. When the counter reaches its maximum count (15), it rolls over, 27, representing the overflow condition whereas although there are no higher bits to allow the further increase of the count value, the lower bits continue as if there were, resulting in the triangle type output count as depicted. The example in FIG. 2 assumes several set up conditions. First, $T_{in}(k)$ has a constant value of 3.25, or 001101 in binary notation where the last 2 (M) bits are fractional and are thus considered to be after the decimal point. Second, the initial value of $A + A'$, is 3.25. Third, the value of $T_{in}$ has been successfully written into the hold-register and is held at its output U. And fourth, the counter begins counting from 0. In this case the output at node C, in FIG. 1A, remains 0 until input B=3 at which time the magnitude compare output asserts a logic highF, coupling a rising transition into the delay line and enabling the write strobes of the input hold-register and accumulator section. On the next clock node C returns to 0, and the accumulator output, $A + A'$, increments to 6.5. The delay line has a delay value of $c + 0.25$ resulting in the first output occurring at time $D(1) = 3.25 \times T_{clock} + c$. Since the value of c is unimportant, as it is only a constant offset to all outputs and can thus be calibrated out, it will be set to 0 in order to facilitate the demonstration of the concept. The counter continues to count and when input B=6, the magnitude compare again asserts a logic high and the above process is repeated resulting in an output pulse occurring at the delay line output at time $D(2) = 6.50 \times T_{clock} + c$. In FIG. 2 this process is shown graphically. The value of the remainder, 23, is multiplied by the time gain of the delay line which is simply the slope of the interpolation function, 22. The resulting output of the delay line has a time shift, 24, of the remainder times the clock period, $T_{clock}$. Thus the output period, $D(2) - D(1)$, is equal to the input period value programmed, $T_{in}$, times the system clock period on an instantaneous basis. This process continues as shown in FIG. 2 even through the point of counter, 27, and accumulator, 28, overflow. So long as the input period, $T_{in}(k)$, is greater than or equal to 1 and less than $2^n$ (16 in this case) the accumulator will always roll over before the counter, and at the time of the next occurrence of A=B both A and B will have lost the same numerical value of 16 due to the roll over in each. Thus, since counter and accumulator always roll over as described given the conditions stated, the output period generation process will continue unaffected by the roll over. The result is a precise synthesis of the programmed period value, limited only by the accuracy of the delay line. Note that the output of the magnitude compare, 25, fluctuates in period due to the truncation process, while the output of the delay line, 26, does not due to the addition of the remainder into the delay. Note also that the delay line has the property that one pulse of fixed width, of less than one clock period in duration, is produced at the output for each clocked high input from the magnitude compare. This allows for consecutive 1's at the output of the magnitude compare making it possible to produce output periods as short as the clock period itself. It should be noted that it is unnecessary for each of the input values, $T_{in}$, to be 3.25 in this example. If a memory was placed before the input hold-register in FIG. 1A and its address incremented by the same accumulator write strobe as the hold-registers it should be possible to load any sequence of input periods, $T_{in}(k)$, without altering the dynamics of circuit operation. The resulting output would then be a faithful rendering of the sequence of programmed words, or vectors, times the system clock period, $T_{clock}$. Thus, any sequence of output periods can be programmed.

Figure 3:
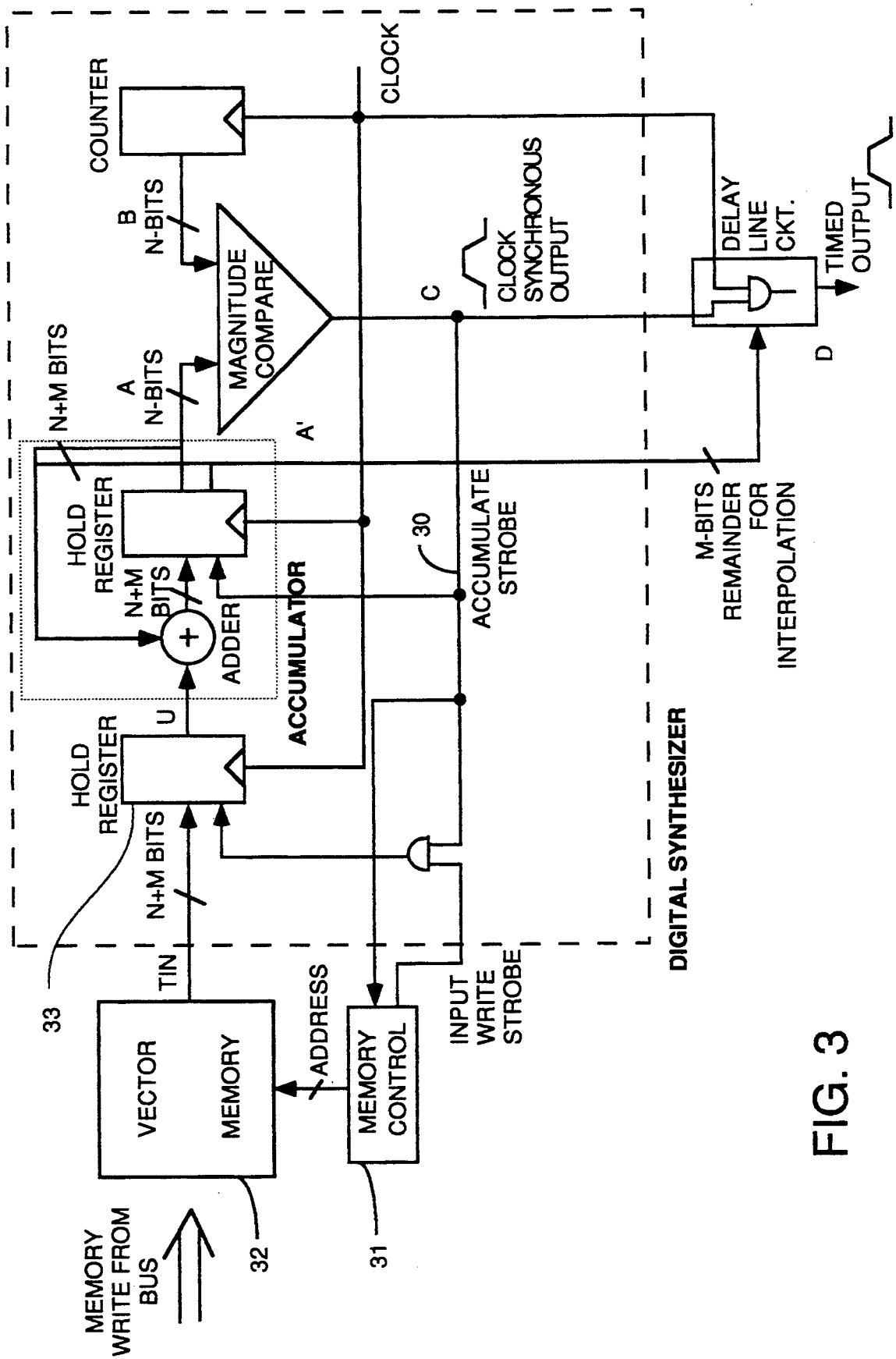
FIG. 3 shows the schematic block diagram of an improved embodiment of the invention including a Vector Memory.

FIG. 3 shows the schematic diagram of such a system. The memory control, 31, which increments the memory, 32, contains a synchronous counter of depth which is determined by the depth of the memory as well as some miscellaneous logic for control functions. The width of the data part of the memory is N+M bits. The system is the same as that in FIG. 1A except that when the accumulator strobe, 30, goes high, the memory counter is enabled, causing it to increment the memory address on the next system clock cycle. Thus, when the strobe is high and the clock occurs, the input hold register, 33, writes the old memory output to the position U while the address to the memory changes causing a new data word to appear at the memory output. Before the system is started the memory is written from a microprocessor or other means with the desired sequence of output periods, $T_{in}(k)$. Once the circuit is started it will output the sequence as many times as desired with branching and looping possible depending on the complexity of the memory control. Many memory control functions such as looping, branching, and combinations of loops and branches are known in the art and may be applied to the invention for the purpose of creating complex sequences of periods for the purpose of testing integrated circuits for timing and jitter responses. Furthermore this system can be used to create an actual communication channel where information is carried on complex time modulated signals. In such an embodiment the invention may serve as a mechanism for encoding information onto a complex digital waveform for the purpose of transmission of this information across some communication link to a receiver capable of demodulating the information. In this embodiment the invention would form the transmitter in a digital communication link.

Figure 4:
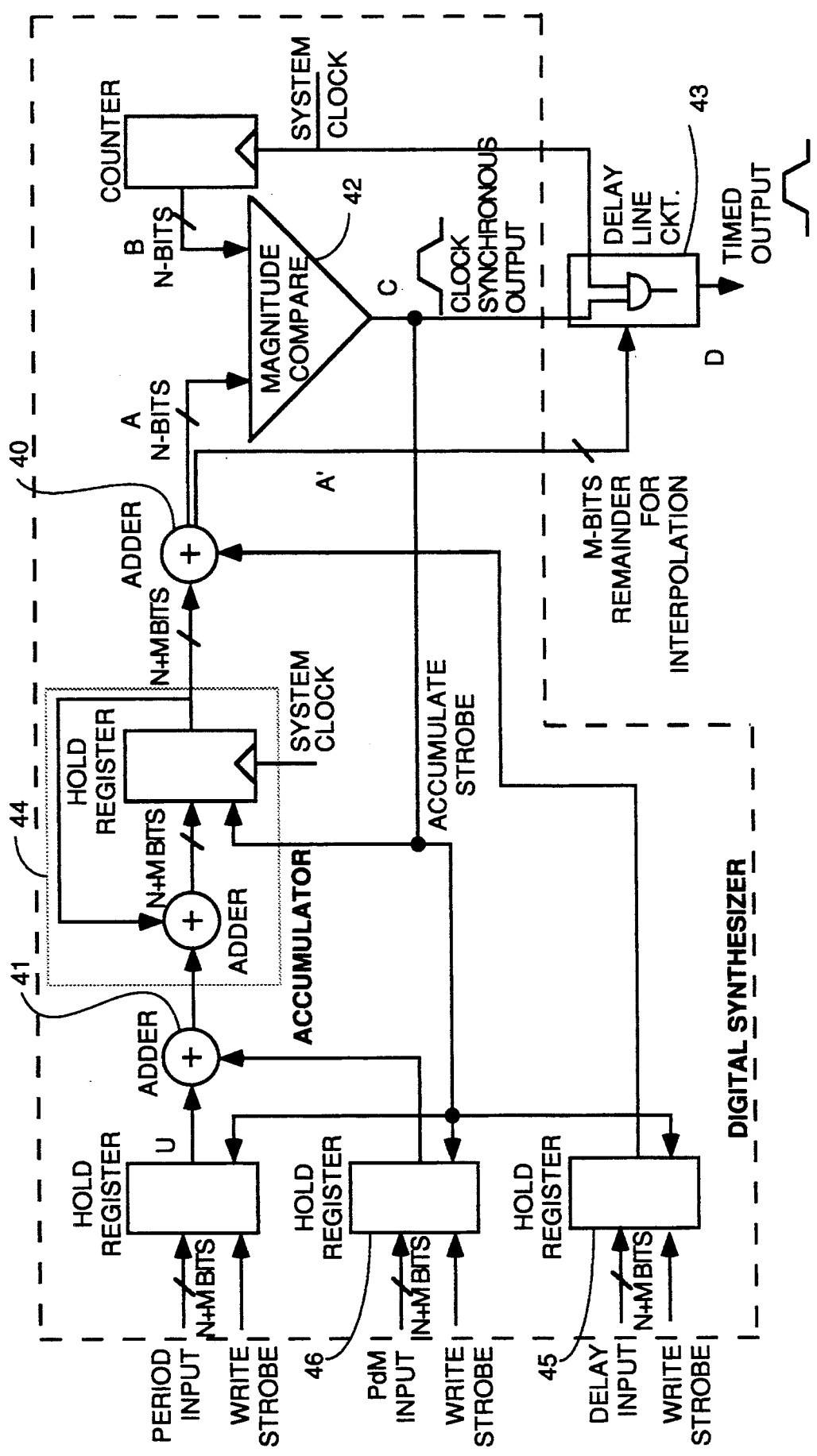
FIG. 4 shows a schematic block diagram with a further improvement to the digital synthesizer portion of the apparatus by way of introduction of a digital adder.

A further enhancement to the digital synthesizer portion of the invention is depicted in FIG. 4. Another adder, 41, may be placed after the input hold register at node U and before the accumulator section, 44. Still another adder, 40, may be placed after the accumulator section, 44, and before the magnitude compare, 42. The adder, 40, after the accumulator, 44, will allow the direct injection of a delay of fixed amount into the quantity A at the input of the magnitude compare, 42, and A' at data input of the delay line, 43. Since this quantity is added after the accumulator it has no effect on the average period but instead causes a timing shift of the entire sequence of output periods. There is an instantaneous shift in the output period at the time of the application of the input, however. Thus, this input can be used to perform a delay modulation of the synthesizer output signal. The adder, 41, before the accumulator allows for the modification of the input period word, U, from a separate input. This can be used in a manner analogous to frequency modulation (FM) input of a conventional synthesizer, except that the period is directly modulated rather than the frequency. Both of these adder inputs will need hold registers at their inputs to hold input data. The inputs to these hold registers have been labeled Delay input, 45, and PdM (Period Modulation) input, 46. These enhancements allow for hardware based modulation circuits such as Digital Signal Processors (DSP) or Direct Digital Synthesizers (DDS) to be connected to the apparatus providing continuous, high frequency modulation of a programmed period sequence.

Figure 5:
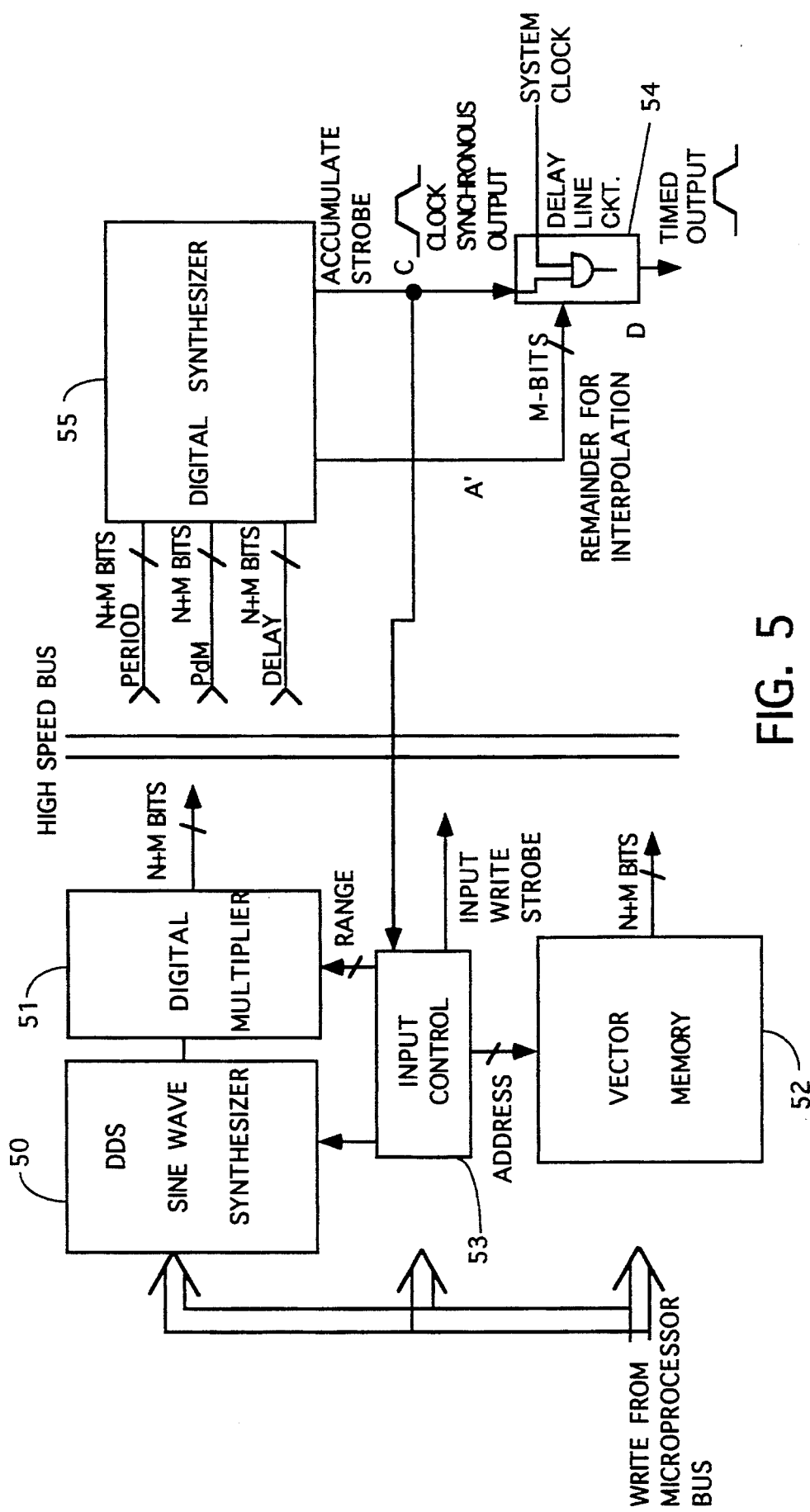
FIG. 5 shows a block diagram of the apparatus with a further improvement by way of addition of a DDS device and a digital multiplier.

For example, FIG. 5 depicts the connection of a DDS generator, 50, to a digital multiplier, 51, which then connects to a high speed bus allowing connection to any of the input ports of the digital synthesizer. If a communication test sequence is loaded into the vector memory, 52, which is connected to the Period port of the digital synthesizer, 55, and a DDS sine wave generator circuit, 50, is coupled with a digital multiplier circuit, 51, to provide a digitized sine wave of programmable frequency and amplitude to the delay port of the digital synthesizer, 55, an output consisting of the communication test sequence with a sinusoidal timing modulation (jitter) is produced. This combination of circuits forms a basic structure of the jitter generator, allowing the user to program a test sequence, perhaps containing complex sequences of periods, and then directly add a sinusoidal jitter to that sequence to emulate a noisy signal. The input control, 53, now includes memory control as well any control logic for the DDS generator and multiplier circuits. A microprocessor or other computer interface writes the vectors, DDS frequency and amplitude as well as controlling miscellaneous writes to registers for reset and other control functions. In another embodiment this high speed bus might be replaced by simple direct connections of the multiplier and memory to the apparatus; however, the flexibility in programming provided by the bus structure is preferred. In still another embodiment a jitter modulation source other than DDS might be used to produce non-sinusoidal types of jitter functions such as square waves or gaussian distributed random jumps.

Figure 6:
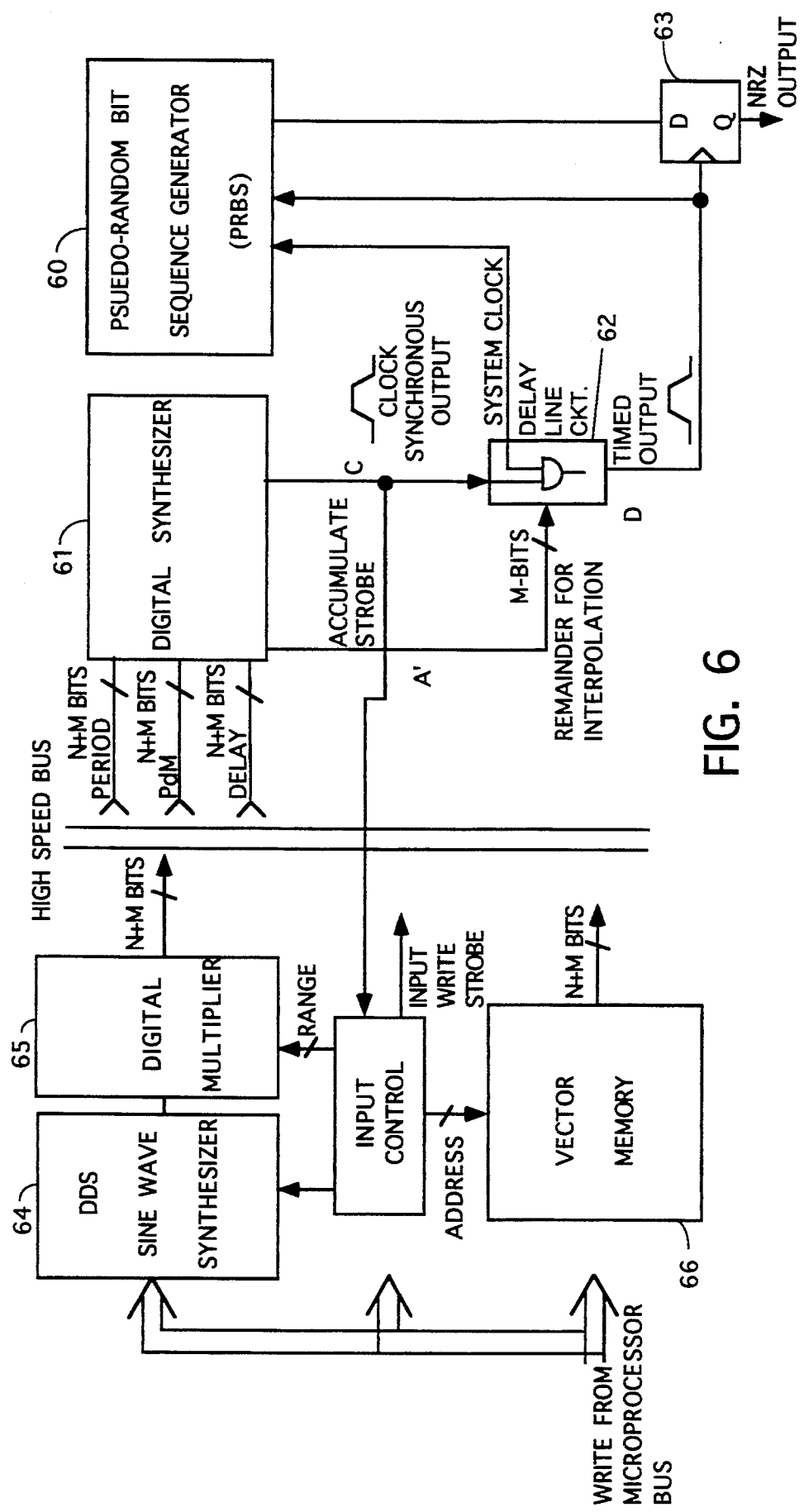
FIG. 6 shows a further improvement to the apparatus in FIG. 5 by way of addition of a PRBS generator.

Further logical operations must be performed on the period outputs from the delay line, 54, to get a real digital communications signal, but the apparatus shown in FIG. 5 will provide all of the timing information required to create a fully functional jitter generator. A fully functional non-return to zero (NRZ) format jitter generator is shown in FIG. 6. The psuedo-random bit sequence (PRBS) generator, 60, is combined with the output of the digital synthesizer, 61, and delay line, 62, as shown. A typical PRBS generator is described in CCITT Rec. 0151. Blue Book, Vol. 4 Fascicle IV.4 Recommendation 0.151, pp. 171–175, incorporated herein by reference. FIG. 6 shows one of many possible methods for integrating a PRBS generator with the invention in order to produce a test waveform. In this case, the output of the delay line is used to clock the PRBS generator, 60, and a D-type flip-flop, 63, is used to combine the data of the sequence generator with the timing information provided by the digital synthesizer with delay line correction. The output is an NRZ data stream as might be found in any of many communication links with an added jitter of frequency determined by the DDS generator, 64, and time amplitude as determined by the digital multiplier, 65. In this application the vector memory, 66, would be used to do only program delays and center period values for the digital synthesizer. In another embodiment of the invention the PRBS generator could be replaced with a serial source providing other bit patterns such as an elastic buffer and a live traffic feed for modulating real communication channel traffic for the purpose of system diagnostics.

in such an embodiment the logical function of the pointer can be described by the following table.

| INPUT<br>Mag. Compare Output | INPUT<br>Delayed Acc. Strobe | CURRENT STATE<br>Current Pointer Value | NEXT STATE<br>New Pointer Value |
| --- | --- | --- | --- |
| 0 | 0 | R | R |
| 0 | 1 | R | R − 1 |
| 1 | 0 | R | R + 1 |
| 1 | 1 | R | R |

Two further improvements in current invention can be made which will enable the highest possible frequency of operation of the digital circuitry comprising the synthesizer and memory interface. The first is the use of a technique called pipelining, which is well known in the art, to speed the processing of the digital circuits at the expense of latency. The principals of this technique are fully developed in the following text: Hennessy and Patterson, *Computer Architecture A Quantitative Approach*, Morgan Kaufmann Publishers, Inc., San Mateo, Calif., 1990, which is incorporated by reference. Chapter 6, entitled "Pipelining", describes this technique in detail. The effect of increased latency in the invention is to increase the number of clock cycles required for the data input to the apparatus to propagate through the adders, accumulator, and magnitude compare to the output. This penalty, however, is not inhibiting in the applications described so far in this disclosure.

Figure 7:
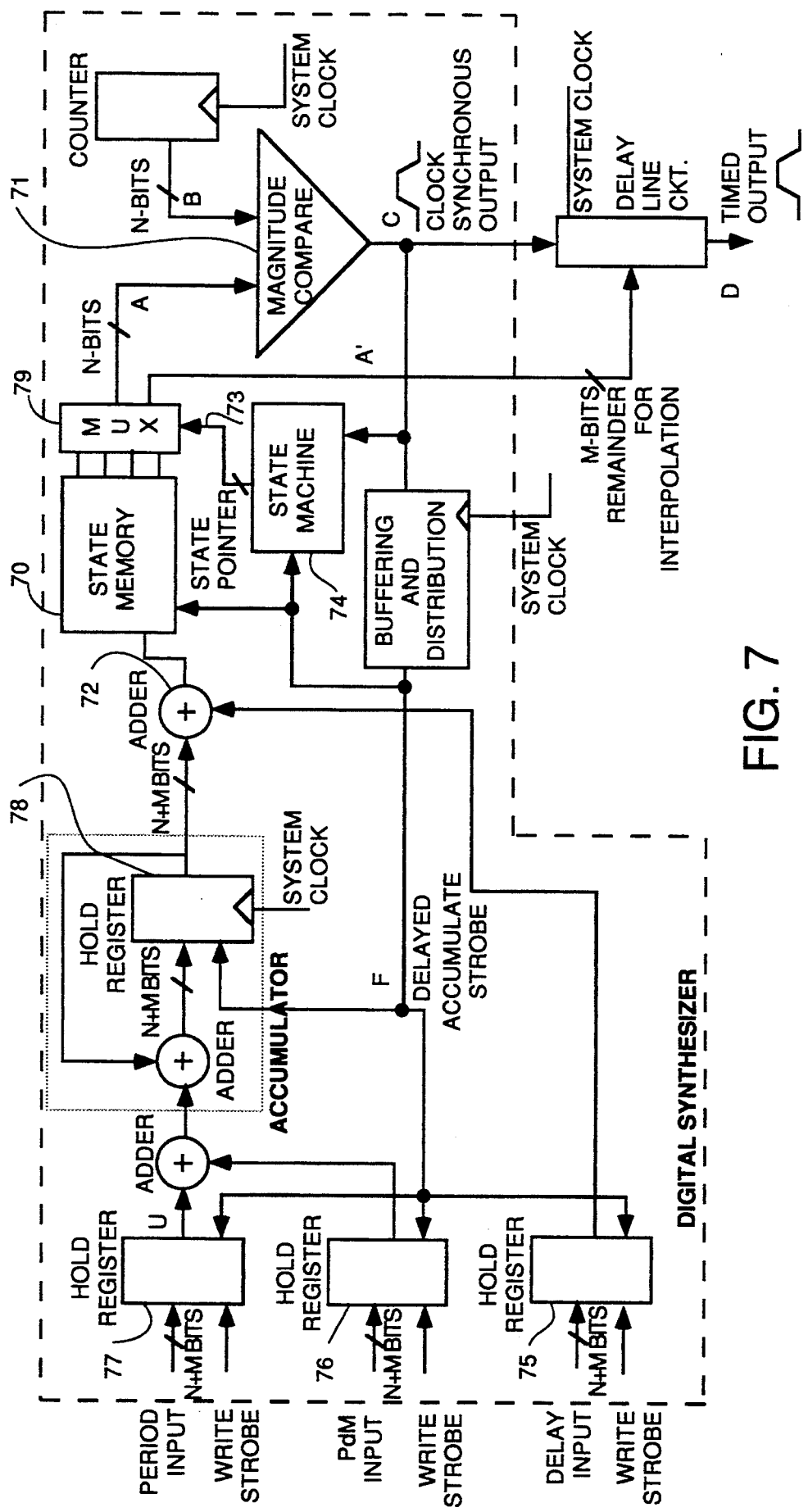
FIG. 7 shows a schematic block diagram of a further improvement to the digital synthesizer portion of the apparatus by the addition of a state memory.

The second improvement is depicted in FIG. 7. The addition of what will be referred to herein as "state memory", 70, and a multiplexer, 79, between the input of the magnitude compare circuit, 71, and the output of the adder, 72, enables the relaxation of timing constraints on the accumulator strobe signal internally and especially with regard to the incrementing of external memory. The state memory effectively stores some number, typically 3 or 4, of time vectors which are to be applied to the input A of the magnitude compare. A pointer, 73, is used to reference the "current state" in the memory by addressing the multiplexer, 79, which constitutes the input A. In the highest speed embodiment of the invention the distribution of the accumulator strobe signal to all required registers and the accumulator in less than one clock cycle is problematic. The storage of extra states of the input in the state memory allows a number of cycles to be used to distribute the accumulator strobe signal to the chip and especially to the external memory circuitry, without interrupting the appearance of new data at the input A. If a state memory is included with S states storage then the distribution of the accumulate strobe can take as long as S clock cycles. The pointer must still be incremented in only one clock cycle; however, the pointer is driven from a small state machine, 74, which is both a smaller load and a much shorter critical path than in previous embodiments in which all of the registers, 75,76,77,78, are directly connected to the magnitude compare output. The state memory, 70, may consist of a section of random-access memory (RAM) if such a device is available in the technology chosen for integration of the invention.

Figure 8:
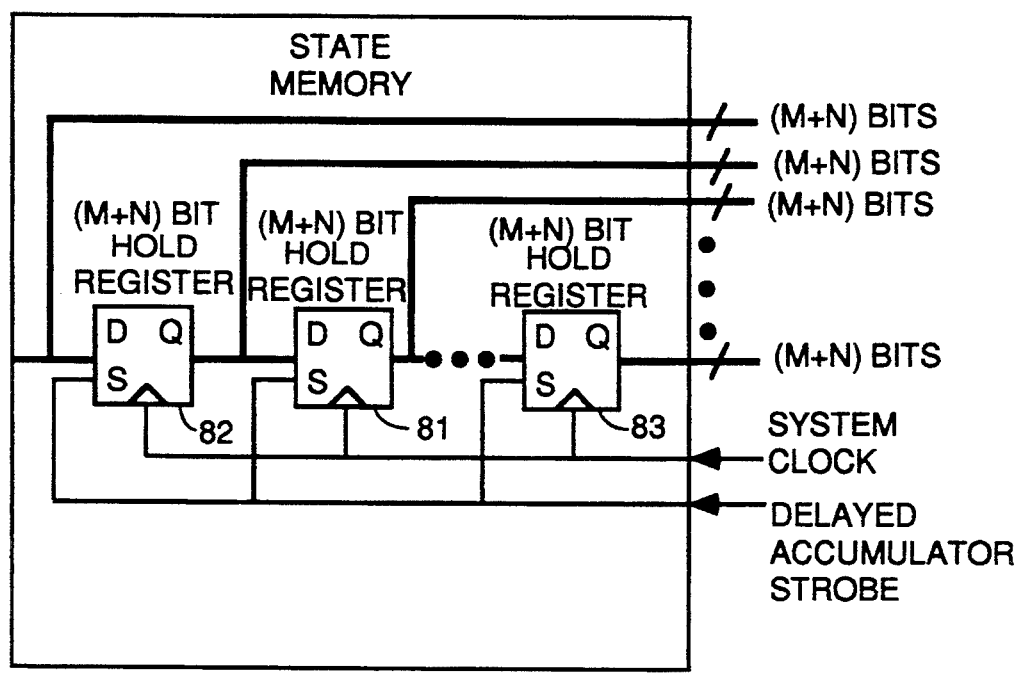
FIG. 8 shows a schematic diagram of the state memory.

For highest speed operation the preferred arrangement of the state memory is depicted in FIG. 8. Here the memory simply consists of sequential banks of registers, such as those shown, 81, 82, 83, M+N bits in width and S states in length. Returning to FIG. 7 it is seen that the pointer inputs are the magnitude compare output C and the actual delayed accumulator strobe F. If the pointer has some current value R and the inputs are as shown in the table, on the next clock cycle the pointer will either increment up, down, or remain at the same value. This state table is particular to the case of the series register type of state memory shown in FIG. 8 where the registers shift data down the chain of S stages each time a delayed accumulator strobe occurs. The new data enters on the left side and the old data is shifted out on the right side. In the case of an imbedded RAM type of state memory the state table of the pointer would be somewhat different although derivable from simple state diagram techniques known in the art. In such a case a write pointer would also be needed to properly direct the data out of the last adder in the chain into the memory.

In other words the state memory is like a memory stack which stores extra target words allowing there to be a slippage in the synchronization of the output of the magnitude compare, which provides the accumulator strobe, and the delayed accumulator strobe, which has been buffered and distributed over the entire circuit. This slippage, or difference in the number of magnitude compare circuit outputs that have occurred and the number of delayed accumulator strobes which have occurred may be as large as the S states available in the state memory, or stack. The addition of such a state memory overcomes the normal limit on the maximum speed of the system, which is usually due to the delay required for the buffering and distribution of the accumulator strobe signal, by allowing this slippage to occur. Another term often used to describe such a configuration of memory is an elastic store. Thus the slippage in the data is allowed by the elasticity of the storage means.

Figure 9A:
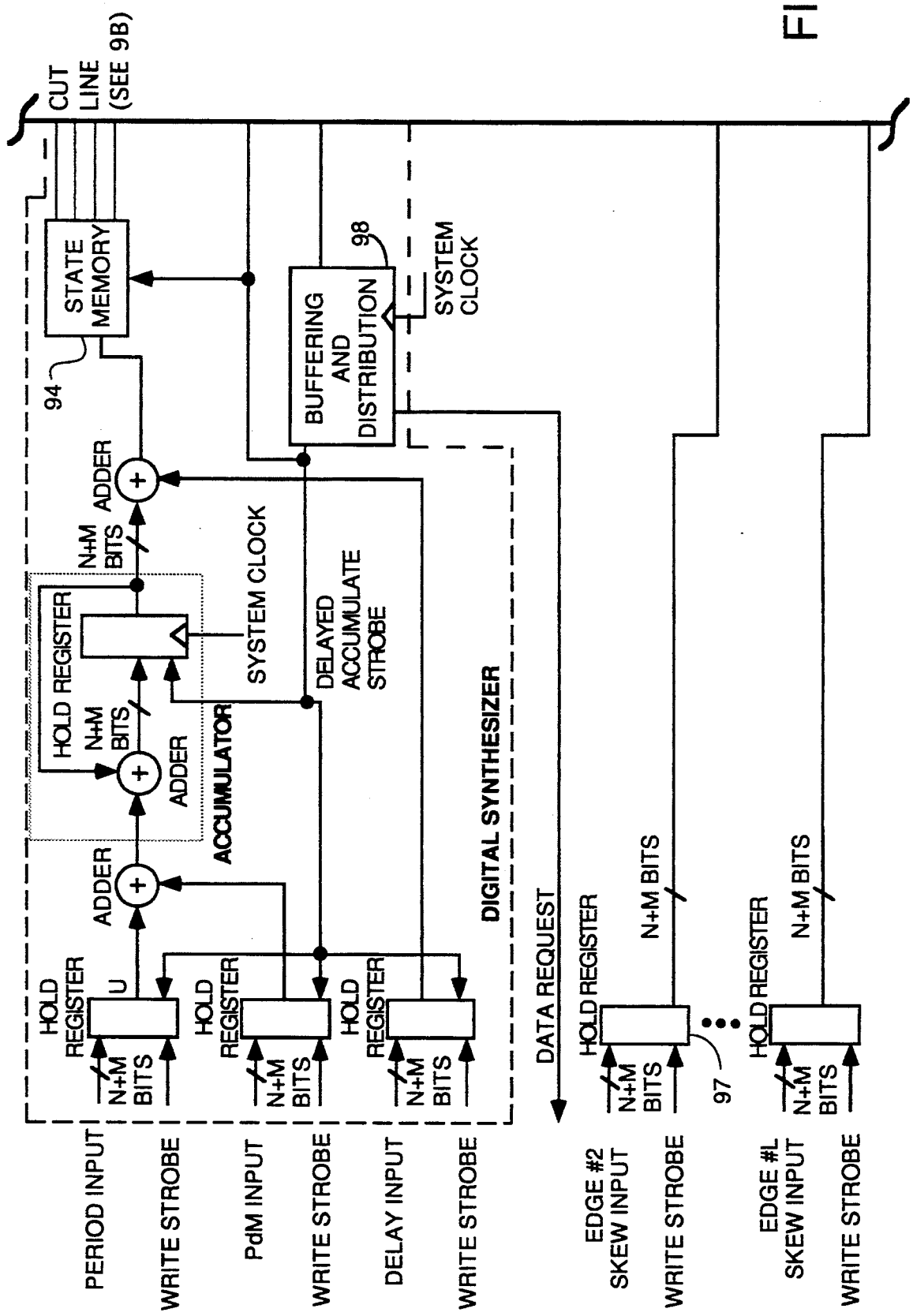
FIGS. 9A and 9B show a schematic diagram of the apparatus with the further improvement of multiple channels.
Figure 9B:
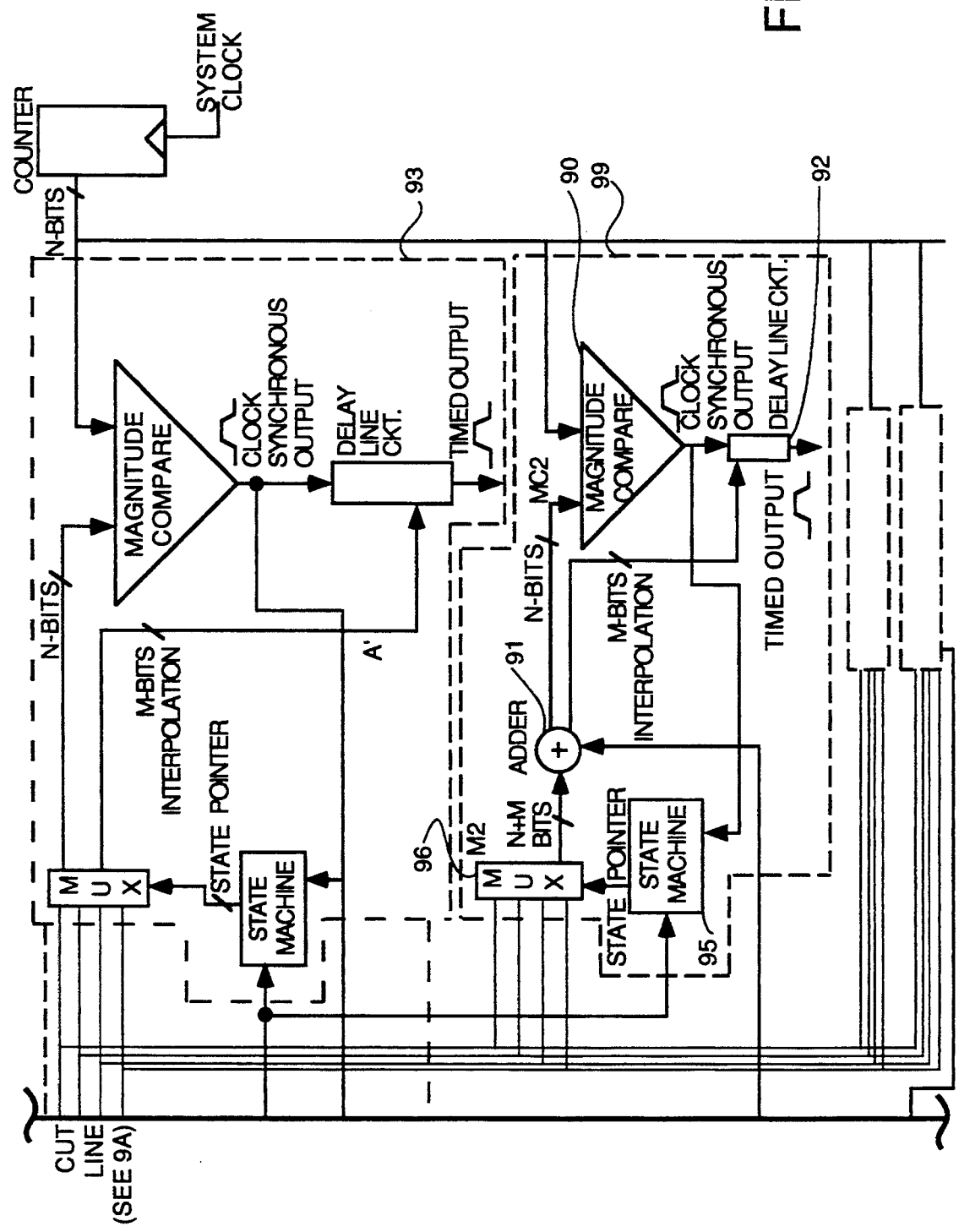

Another useful enhancement to the invention, shown in FIGS. 9A and 9B, is the addition of one or more slave channels, 99, which use the same accumulator output as the master channel. The addition of another magnitude compare, 90, in concert with another digital adder, 91, and delay line, 92, allows the creation of a slave channel, 99, which will remain locked to the main channel but with some offset as introduced by the new adder, 91. One or more channels created in this way allow for the creation of multiple transitions within a single period, the period being defined by the master channel, 93. These additional transitions created by the one or more additional channels may then be logically combined along with the master channel to accomplish tasks such as pulse width control, creation of two periods of half the length of the original output period (frequency doubling), or the creation of multiple skewable channels. Each of these channels may be made to simply connect to the state memory, 94, with independent access and an independent pointer, 95. The new adder, 91, works in the same manner as the adder connected to the delay input register described earlier. It adds only a time offset to the digital word M2 which comes out of the multiplexer, 96, and connects to the state memory. This yields an input to the additional magnitude compare, MC2, which causes a delay of the additional output of some number of clock cycles with reference to the master channel, as determined by the value of the Edge Skew Input, 97. The restriction governing the skew limits on the one or more additional channels is that the pointer for each of the additional channels must not increment beyond the S states available in the state memory. This restriction is straightforward to work out for both a given amount of state memory and number of clock cycles delay in the accumulator write strobe buffering and distribution, 98.

Figure 10:
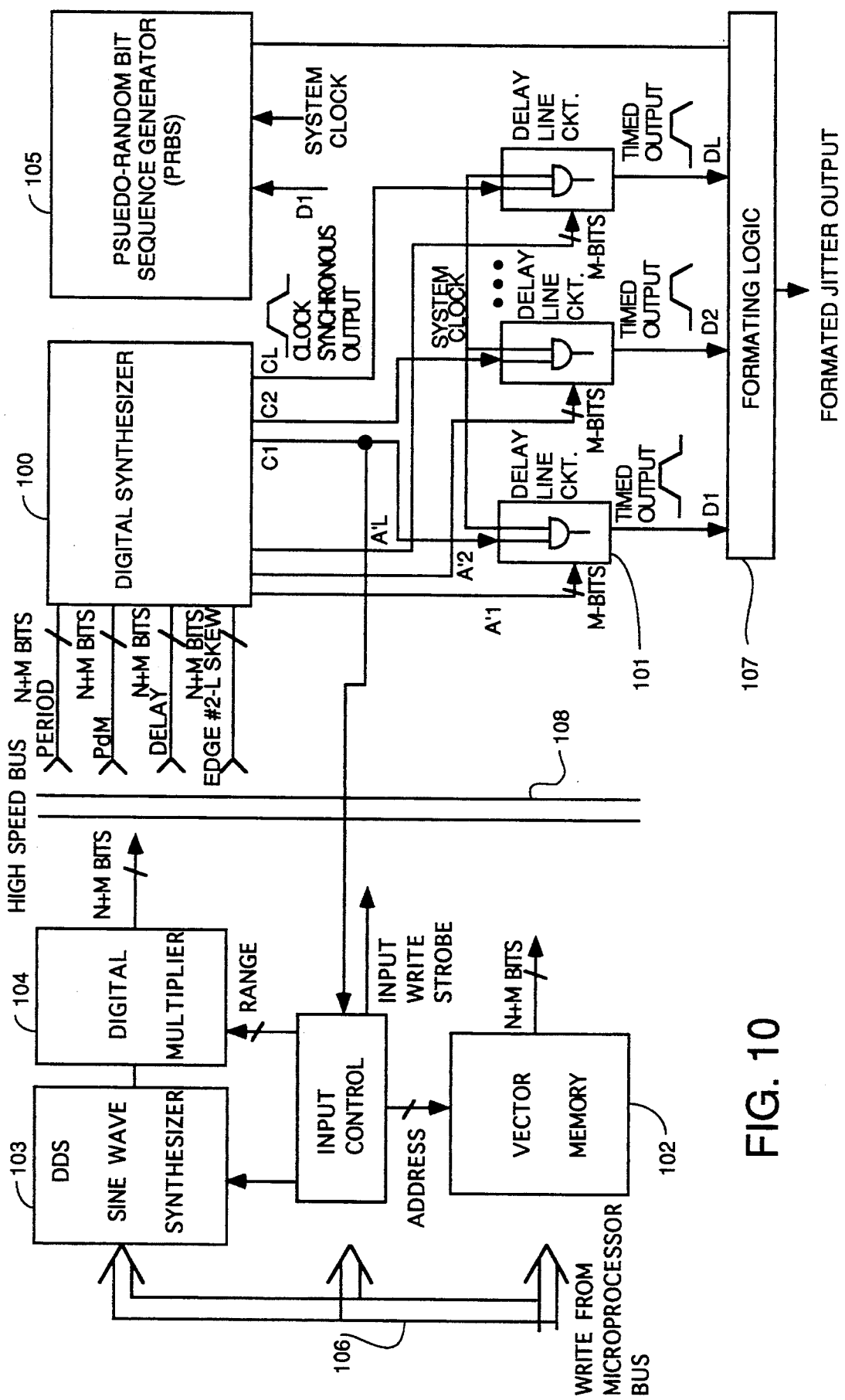
FIG. 10 shows the block diagram of the preferred embodiment of the invention for the application of jitter generation.

The preferred embodiment of the jitter generator invention includes all of these enhancements and features as shown in block diagram form in FIG. 10. However, it is also recognized that there are other applications such as pulse generators for microprocessor test, a transmitter in a communication link, and general digital synthesis of periods, where only a few of the features presented in this disclosure are required. It is further recognized that many more possible combinations of the basic invention and the various enhancements to it are possible than are specifically discussed in this disclosure or specifically shown in the figures.

In the preferred embodiment there is a digital synthesizer, 100, including the enhancements described in this disclosure, with one or more delay lines, 101, connected to its output. There is a vector memory, 102, which stores period sequences as well as delay and edge skew sequences. There is a hardware DDS generator, 103, which interfaces through a digital multiplier, 104, to the Delay and PdM input ports on the digital period generator that provides high speed digitized sine wave delay modulation to a given period sequence. There is also a PRBS generator, 105, which provides codes as specified in previously described communications standards. The timed outputs from the L delay lines is combined with the PRBS data in the formatting circuit, 107. This circuit may be just a single flip-flop or a more complex logic circuit used to combine the multiple timing signals with the PRBS data. Given a defined application such as period halving (frequency doubling) one skilled in the art would easily be able to construct such a formatting circuit. Finally, there is a of microprocessor or computer bus interface, 106, to the entire system to load period and modulation sequences and control the apparatus. The memory and DDS generator are also connected to a high speed bus, 108, which connects them to the digital synthesizer, allowing for flexible programming and high speed modulation of complex waveforms. This embodiment contains the features necessary for the jitter generation applications described in this disclosure with the advantages of large jitter amplitude range, wide jitter modulation bandwidth, synthesizer accuracy, and the advantages of digital architecture. The entire system described may be integrated on a single monolithic integrated circuit, although in some cases it may be advantageous to integrate the delay line, or lines, or other components on a separate chip.

What is claimed:

1. A digital synthesizer for synthesizing a signal having one or more user programmable periods, comprising:

a system clock:

a magnitude comparator circuit having first and second compare inputs for receiving digital values to be compared, and having an output at which appears a strobe signal indicating when the values at said first and second compare inputs are equal, said strobe signal being the output of said digital synthesizer;

a memory having a data input, and address input and a data output, for storing a plurality of digital input words, each said digital input word defining one said user programmable period for said synthesized signal, said address input for receiving an address signal which controls which of said digital input words appears at said data output;

a hold register having a clock input coupled to receive clock signals from said system clock and having a data output, and having a data input coupled to said data output of said memory to receive the selected digital input word and store said input word temporarily while simultaneously presenting said selected digital input word on said data output, said hold register also having a strobe input coupled to receive said strobe signal from said magnitude comparator circuit, said hold register for transferring whatever digital input word exists at said data input to said data output of said hold register upon receiving said the next clock signal after activation of said strobe signal;

an accumulator circuit having a data input coupled to said data output of said hold register, and having a data output, and having a clock input coupled to said system clock for receiving clock signals, said data input for receiving a selected digital input word U from said hold register, and for adding said selected digital input word to the contents of said accumulator and presenting the result at said data output of said accumulator as the present value of said accumulator, said present value serving as a target word for said magnitude comparator circuit, said data output coupled to said first compare input of said magnitude comparator, said accumulator also having a strobe input coupled to receive said strobe signal from said magnitude comparator circuit, said strobe signal for causing said accumulator circuit to add said input data word, U, to the present value at said accumulator data output upon the arrival of the next clock signal;

a synchronous counter circuit having an output at which appears the current value of said counter, said output coupled to said second compare input of said magnitude comparator circuit, and having a clock input coupled to receive clock signals from said system clock which cause the current value of said counter to increment; and an input coupled to said data input of said memory for receiving said selected digital input words for storage in memory locations of said memory designated by address signals received at said address input.

2. A digital synthesizer for synthesizing an output signal having one or more user programmable periods comprising:

a system clock for providing a clock signal;

an N bit magnitude comparator circuit having first and second compare inputs, each for receiving an N bit digital word, where N is any integer, said magnitude comparator circuit for comparing the magnitudes of said N bit digital words appearing at said first and second compare inputs, and having an output at which a strobe signal transitions to an active state when the magnitudes of said N bit digital words appearing at said first and second compare inputs are equal, said strobe signal comprising said synthesized output signal from said digital synthesizer;

an accumulator circuit having a data input and a data output, the present value of said accumulator appearing at said data output, said accumulator circuit also having a strobe input coupled to receive said strobe signal from said magnitude comparator circuit, and having a clock input for receiving clock signals from said system clock, both said data input and said data output of said accumulator being M+N bits wide, wherein M and N are integers of any selected value, and N represents the N most significant bits presented at either said data input or said data output of said accumulator, and M represents the M least significant bits, said data input of said accumulator circuit serving to receive a digital input word, U, said accumulator for adding said digital input word, U, to the present value of said accumulator upon receipt of the next clock signal after said strobe signal from said magnitude comparator circuit transitions to said active state, with the resulting sum being presented at said data output of said accumulator, only said N most significant bits appearing at said data output of said accumulator being coupled to said first compare input of said magnitude comparator circuit, and wherein said M least significant bits at said data output are unconnected but effect the value of said N most significant bits through internal carry operations occurring within said accumulator;

an N bit synchronous counter having a clock input coupled to receive clock signals from said system clock, and having an N bit wide data output coupled to said second compare input of said magnitude comparator circuit, said synchronous counter for incrementing a count upon receipt of each clock signal and presenting said count as an N bit digital word at said second compare input;

an input coupled to said data input of said accumulator for receiving said digital input word, U, comprised of N most significant bits and M least significant bits.

3. The apparatus of claim 2 further comprising an N bit input port and an N bit digital adder with first and second digital inputs each of which is N bits wide, where N is any selected integer, and each of said inputs of said digital adder for accepting a digital value to be summed with the digital input word presented at the other digital input of said adder, the resulting sum being presented at an output of said digital adder which is N bits wide, and wherein said data output of said accumulator is not connected to said magnitude comparator circuit but has the N most significant bits thereof coupled to said first N bit input of said digital adder, and wherein said N bit output of said digital adder has its output coupled to said N bits of said first compare input of said N bit magnitude comparator circuit, and wherein said second N bit input of said digital adder is coupled to said N bit input port for receiving an N bit digital word defining a desired delay thereby allowing the digital word applied to said magnitude comparator circuit from the accumulator circuit side to be altered either temporarily or permanently without altering the incrementation operations of said accumulator circuit.

4. The improvement of claim 2 further comprising a memory coupled to said accumulator data input, said memory for storing a sequence of input values for input as said digital input word, U, to said accumulator of said digital synthesizer for setting the period of the signals synthesized thereby.

5. The improvement of claim 3 further comprising a first memory coupled to said accumulator data input, said first memory for storing a sequence of input values for input as said digital input word, U, to said accumulator of said digital synthesizer for setting the period of the signals synthesized thereby, and further comprising a second memory having a data output coupled to said second N+M bit input of said digital adder, said second memory for storing a plurality of delay input values which may be selectively applied to said second input of said digital adder.

6. A digital synthesizer for synthesizing a signal having a user programmable period, comprising:

a system clock for providing a clock signal having a period equal to $T_{clock}$;

an N bit magnitude comparator circuit having first and second compare inputs for receiving digital values to be compared, each of said digital values being N bits wide, where N is any integer, and having an output at which a strobe signal becomes active when the digital values at said first and second compare inputs are equal;

an accumulator circuit having an input and an output, each of which is N+M bits wide, where N and M are each any selected integer, said accumulator having a clock input coupled to receive clock signals from said system clock, said data input of said accumulator circuit for receiving a digital word to be added to the current value presented by said accumulator at said data output thereof, and wherein the most significant N bits of said accumulator output are coupled as a target word to said first compare input of said N bit magnitude comparator circuit, and also having a strobe input coupled to said output of said magnitude comparator circuit for receiving said strobe signal, activation of said strobe signal causing said accumulator circuit to add whatever data word exists at said data input to the value presented as said target word at said accumulator data output upon receiving the next clock signal;

an N bit synchronous counter circuit having an output at which the count thereof appears, said output coupled to said second compare input of said magnitude comparator circuit, said counter circuit also having a clock input coupled to said system clock such that the value of the count presented at said output is incremented upon receiving each clock signal from said system clock;

a digitally programmable delay line having a signal input and a signal output and having a clock input coupled to said system clock and having a Q bit data input, for receiving a Q bit digital data input word defining the desired amount of delay, where Q is an integer less than or equal to M, said signal input coupled to receive said strobe signal from said magnitude compare circuit, said Q bit data input of said delay line being coupled to the most significant Q bits of the least significant M bits of said N+M bit data output of said accumulator circuit, said signal output of said digitally programmable delay line presenting the timing corrected digital synthesizer output waveform, said digitally programmable delay line having the property that the propagation delay experienced by a signal propagating from said signal input to said signal output is a linear function of the magnitude of the Q bit digital data input word at said data input of said delay line, said linear function expressed as $c+W\times R=t$, where C is a constant fixed delay, W is the magnitude of the Q bit digital data input word appearing at said data input of said delay line, and R is the resolution of said delay line expressed as a unit of time and is equal to $2^{-Q}\times T_{clock}$, and where t is the magnitude of the delay imposed by the delay line, and wherein said delay line is adjusted such that the maximum delay imposed by said delay line for the maximum magnitude of $W=W_{max}$ minus the minimum delay imposed by said delay line for the minimum magnitude of $W=0$ is equal to the system clock interval $T_{clock}$ minus the resolution R of said delay line, and an input for receiving a digital input word, U, which is N+M bits wide and which defines the desired period of the synthesized signal, said input coupled to said data input of said accumulator circuit.

7. The apparatus of claim 6 further comprising a port for receiving a digital word defining a desired delay value, and further comprising an N+Q bit digital adder having first and second inputs each of which is N+Q bits wide, and each of which accepts digital values to be summed, and having an output which is N+Q bits wide at which appears the sum of the digital input words applied to said first and second inputs, and wherein said data output of said accumulator is not connected to said magnitude comparator circuit but has the most significant N+Q bits thereof coupled to said first input of said adder, and wherein said output of said adder has the most significant N bits thereof coupled to said first input of said magnitude comparator circuit, and wherein said second input of said adder is coupled to said port for receiving said digital word defining the desired delay value, and wherein said most significant Q bits of said least significant M bits at said data output of said accumulator circuit are not connected to said Q bit input of said digitally programmable delay line, and wherein said least significant Q bits of said output of said adder are coupled to said Q bit input of said digitally programmable delay line.

8. The improvement of claim 6 further comprising a memory coupled to said input of said accumulator circuit, said memory for storing a sequence of input values for sequential input at said port for receiving digital word, U, thereby setting the period of the signals synthesized by said digital synthesizer.

9. The improvement of claim 7 further comprising a first memory coupled to said data input of said accumulator circuit, said first memory for storing a sequence of input values for sequential input at said port for receiving digital word, U, thereby setting the period of the signals synthesized by said digital synthesizer, and further comprising a second memory having a data output coupled to said second input of said digital adder coupled to said accumulator circuit, said second memory for storing a plurality of delay input words which may be selectively applied to said second input of said digital adder.

10. A digital synthesizer for synthesizing a signal having a user programmable period comprising:
a system clock;
synthesizer means coupled to said system clock for digitally synthesizing a signal having a period which is digitally programmable and which is defined by a digital input word, which may represent a fractional quantity, and by the period of said system clock, wherein the frequency of the synthesized signal may be other than a sub-harmonic of the frequency of said system clock.

11. The apparatus of claim 10 further comprising means for adding a digitally programmable delay to selected periods of said signal output by said digital synthesizer.

12. The apparatus of claim 10 wherein said synthesizer means includes a counter which counts a system clock and an accumulator having a strobe input which receives a strobe signal which causes said accumulator to increment an output value, the sequence of output words calculated in this manner being output as digital target words, and including a magnitude comparator circuit having a compare input which receives said target words and compares them to the output of said counter, and when any said target word equals the value of said counter, for activating said strobe signal at an output coupled to said strobe input of said accumulator, and further comprising a digitally programmable delay line coupled to an output of said magnitude comparator circuit, and further comprising state memory means for acting as a pop up stack or elastic store means coupled between said accumulator output and said compare input of said magnitude comparator circuit for buffering said target words for use by said magnitude comparator circuit whenever needed thereby allowing said accumulator and said magnitude comparator circuit to operate at different rates for short periods of time and for buffering and distributing said strobe signal thereby allowing said digital synthesizer to operate at the highest output frequency despite a higher frequency than would otherwise be possible because of parasitic delay in propagation of said strobe signal from said output of said magnitude comparator circuit to said strobe input of said accumulator which would otherwise limit the frequency of operation.

13. A digital synthesizer for synthesizing a signal having a user programmable period, comprising:
a system clock for providing a clock signal having a period equal to $T_{clock}$;
an N bit magnitude, comparator circuit having first and second compare inputs for receiving digital values to be compared, each of said digital values being N bits wide, where N is any integer, and having an output at which a strobe signal becomes active when the digital values at said first and second compare inputs are equal;
an accumulator circuit having an input and an output, each of which is N+M bits wide, where N and M are each any selected integer, said accumulator having a clock input coupled to receive clock signals from said system clock, said data input of said accumulator circuit for receiving a digital word to be added to the current value presented by said accumulator at said data output thereof, and wherein the most significant N bits of said accumulator output are coupled as a target Word to said first compare input of said N bit magnitude comparator circuit, and also having a strobe input coupled to said output of said magnitude comparator circuit for receiving said strobe signal activation of said strobe signal causing said accumulator circuit to add whatever data word exists at said data input to the value presented as said target word at said accumulator data output upon receiving the next clock signal;

an N bit synchronous counter circuit having an output at which the count thereof appears, said output coupled to said second compare input of said magnitude comparator circuit, said counter circuit also having a clock input coupled to said system clock such that the value of the count presented at said output is incremented upon receiving each clock signal from said system clock;

delay means coupled to said output of said comparator and having an input for receiving a signal defining a desired delay, for adjusting the period of the output signal of said digital synthesizer such that any instantaneous period within the resolution of said delay means can be achieved regardless of the period of said clock signal;

an input for receiving a digital input word, U, which is N+M bits wide and which defines the desired period of the synthesized signal, said input coupled to said data input of said accumulator circuit.

* * * * *